United States Patent
Macbeth

(10) Patent No.: US 6,608,741 B1
(45) Date of Patent: Aug. 19, 2003

(54) TWO WINDING RESONATING ARC FAULT SENSOR WHICH BOOSTS ARC FAULT SIGNALS WHILE REJECTING ARC MIMICKING NOISE

(75) Inventor: Bruce F. Macbeth, Syracuse, NY (US)

(73) Assignee: Pass & Seymour, Inc., Syracuse, NY (US)

(*) Notice: Subject to any disclaimer, the term of this patent is extended or adjusted under 35 U.S.C. 154(b) by 3 days.

(21) Appl. No.: 10/029,762

(22) Filed: Oct. 29, 2001

Related U.S. Application Data

(63) Continuation of application No. 09/518,528, filed on Mar. 4, 2000, now abandoned.

(51) Int. Cl.[7] ............................................... H02H 3/00
(52) U.S. Cl. ........................................ 361/42; 324/127
(58) Field of Search ........................... 361/42–50, 93.1, 361/93.6; 324/511, 522, 524, 536, 541, 127, 117 R, 76.51; 336/145, 147, 170, 171; 73/DIG. 2; 335/6, 18, 84, 100, 101, 180, 182, 215, 297, 299

(56) References Cited

U.S. PATENT DOCUMENTS

| | | | | |
|---|---|---|---|---|
| 3,780,348 A | * | 12/1973 | Loukidis | ...................... 361/45 |
| 5,382,896 A | * | 1/1995 | Schueller et al. | ........... 324/127 |
| 5,986,860 A | * | 11/1999 | Scott | ........................... 361/42 |
| 6,094,043 A | * | 7/2000 | Scott et al. | ............. 324/117 R |
| 6,191,589 B1 | * | 2/2001 | Clunn | ........................ 324/424 |

* cited by examiner

Primary Examiner—Ronald W. Leja
(74) Attorney, Agent, or Firm—Wall Marjama & Bilinski LLP

(57) ABSTRACT

An arc fault detector for detecting electric power lines includes a current transformer preferably in the shape of a toroid, with a neutral conductor and at least one line conductor passing through the aperture of the toroid. The sensor has two multi-turn windings each formed around a portion of the toroidal core, with one winding adjacent to each of the hot and neutral wires respectively, with both windings connected in series in a way which re-enforces arc fault noise generated by arc faults involving the line and neutral, but which causes signal reduction for noise signals from the line and neutral, or either, to ground. The windings and core are also selected to self resonate at a frequency or over a band of frequencies that excludes power line carrier frequencies but which includes arc fault frequencies. The core may also have a third winding, acting as a grounded neutral transmitter, or ground fault detector, or instead of a third winding, one of the arc fault sensing windings can act as dual function sensor for both.

28 Claims, 4 Drawing Sheets

TWO WINDING RESONATING ARC FAULT SENSOR WHICH BOOSTS ARC FAULT SIGNALS WHILE REJECTING ARC MIMICKING NOISE

CROSS REFERENCE TO RELATED APPLICATION

This is a continuation application of U.S. Ser. No. 09/518,528, filed Mar. 4, 2000 now abandoned the entirety of which is incorporated herein by reference.

BACKGROUND OF THE INVENTION

1. Field of the Invention

This invention relates generally to a small economical current sensor that can be used in an inexpensive Arc Fault Circuit Interrupter (AFCI) that may also provide Ground Fault Protection, and more particularly to an arc fault current sensor which has common and single mode to ground noise rejection and bandpass filtering features, and which also may act as a grounded neutral feedback transmitter, or ground fault detector, when used in a combination device.

2. Description of the Prior Art

Arc detection is an enhancement to thermal and magnetic overload detection typically used in circuit breakers, which may not otherwise detect and respond to arc faults. A number of devices for detecting arc faults and methods of detection have been used in the past. These include E and B field arc sensors, detecting the magnitude of the rate of change of current signals when an arc fault occurs, the use of non-overlapping band pass filters to detect white noise characteristic of arcs, and detecting the disappearance of signals indicating the presence of arcs near zero current crossings. While some of these techniques are more or less effective, they require relatively sophisticated arc sensors and circuits. Heretofore, most arc detection circuits have been incorporated in circuit breakers because, among other things, the circuits were too large to fit in a wiring device such as a receptacle.

There is a need for simple economical arc fault detectors that can be included in wiring devices such as receptacles, plugs, or in-line devices, and that offer the same protection as an arc fault detector incorporated in a circuit breaker, but at lower cost.

There is a need for an arc fault detector in wiring devices that can be provided at a reduced cost compared with arc fault detecting circuit breakers which is comparable to the reduction in cost between ground fault interrupting receptacles and ground fault interrupting circuit breakers.

There is the need for a sensor and associated circuitry for an AFCI that is miniaturized. There is also need for a sensor and associated circuitry that effectively senses and allows protection against both arc faults and power line grounded neutral faults.

This invention discloses an Arc Fault detector with a sensor having a winding configuration that rejects common mode, and single mode to ground noise originating from the line side of the device, which may mimic arc fault noise. The sensor also enhances the signals generated from arc fault noise, while at the same time performing the dual function of a grounded neutral transmitter, or of a ground fault detector, which permits a much smaller and less expensive current transformer sensor to be used without sacrificing the detector's ability to respond to a broad range of arc fault currents. This allows a less expensive and smaller overall circuit which can be constructed to fit into a wiring sized device and which may also permit a dual-purpose arc and ground fault detection circuit.

It is an object of this invention to provide an arc fault circuit interrupter, also known as AFCI, that employs an electrical circuit that is simple enough, inexpensive enough and small enough to be included in wiring devices.

It is another object of this invention to provide an arc fault circuit interrupter that is sensitive to relatively low amplitude series arc faults of at least 5 amps of arc current, typically in series with the load and commonly referred to as Type A faults.

It is another object of this invention to provide an arc fault circuit interrupter that detects parallel or line to line arcs producing currents of 75 amps or more, commonly referred to as Type B arc faults.

It is another object of this invention to provide a ground fault circuit interrupter, also known as a GFCI, that detects power line frequency leakage to ground, typically 60 Hertz, whose current is 5 milliamps or more, or inadvertent neutral connections to ground.

SUMMARY OF THE INVENTION

Briefly stated, and in accordance with a presently preferred embodiment of the invention, an arc fault detector for detecting electric power lines includes a current transformer preferably in the shape of a toroid, with a neutral conductor and at least one line conductor passing through the aperture of the toroid. The sensor has two multi-turn windings each formed around a portion of the toroidal core, with one winding adjacent to each of the hot and neutral wires respectively, with both windings connected in series in a way which re-enforces arc fault noise generated by arc faults involving the line and neutral, but which causes signal reduction for noise signals from the line and neutral, or either, to ground. The windings and core are also selected to self resonate at a frequency or over a band of frequencies that excludes power line carrier frequencies but which includes arc fault frequencies. The core may also have a third winding, acting as a grounded neutral transmitter, or ground fault detector, or instead of a third winding, one of the arc fault sensing windings can act as dual function sensor for both.

BRIEF DESCRIPTION OF THE DRAWINGS

The novel aspects of the invention are set forth with particularity in the appended claims. The invention itself, together with further objects and advantages thereof may be more readily comprehended by reference to the following detailed description of a presently preferred embodiment of the invention taken in conjunction with the accompanying drawings, in which:

DESCRIPTION OF THE PREFERRED EMBODIMENT

Figure 1A:
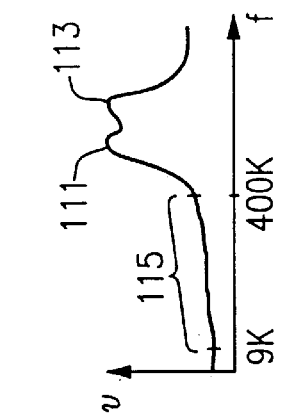
FIGS. 1(A–E) are schematic diagrams of the sensor with windings connected for common mode noise rejection, but arc fault noise addition, and showing a grounded neutral transmitter winding.

This invention discloses an arc fault current transformer sensor intended for an AFCI receptacle.

AFCI receptacles of this type are primarily designed to sense arc faults in extension cords, and the like, which may have low level arc faults which can be difficult to discern from line and load noise.

This invention describes a current sensor which is sensitive enough to detect low level arc faults while at the same time rejecting non arc related noise from the line and load. Much of the difficulty in sensing low level arc faults is in discriminating against arc mimicking noise coming from either the line or neutral to ground, or both, to ground.

When an arc fault starts, typically there is a step change in current followed by broadband arcing noise during the arc. The sensor of this invention responds to both the step and broadband noise of the arc.

Although an AFCI receptacle alone is a useful device, it is desirable to combine an AFCI with a GFCI, since typically both devices are needed, or required, to protect a line. The GFCI also adds a strong AFCI feature, which is an ability to detect very low levels of arc faults to ground. This allows simplification of the AFCI arc detector design for response to only arc faults from line to line, or series with the load, type arc faults.

A problem arises when trying to combine an AFCI/GFCI in one current transformer. The GFCI sensor is designed to ignore load currents flowing from line to line but must respond to line to ground, or neutral to ground, faults. The AFCI sensor, on the other hand, must respond to line to line and series arc faults which the GFCI sensor ignores. This complicates combination into one transformer.

While an AFCI can fully function with one sensor transformer, a GFCI requires both a ground fault transformer for receiving a signal and a grounded neutral transformer for transmitting a signal. This invention describes methods to use either of these transformers as a dual function AFCI/GFCI transformer.

In receptacle embodiments of an AFCI/GFCI combination device, it is required to have the hot and neutral wires form equal primaries for the current transformer sensor. This is standard practice for receptacle GFCI's to provide protection even if the line hot and neutral wires are miswired so that the neutral wire becomes hot with respect to ground. This practice is also required of the grounded neutral transmitter transformer, which must transmit a fault current back through the ground fault sensor when either a neutral load-wire-to-ground fault occurs, or in the case of a miswire, a load hot-wire-to-ground fault occurs. In order to construct a shared ground fault/arc fault sensor transformer, or a shared arc fault sensor/grounded neutral transmitter, both transformers will typically have hot and neutral wire primaries with equal numbers of turns. When the hot and neutral wires form equal primary windings, the magnetic fields around each tend to cancel the other within the sensor core. Transformer output is much greater for currents from line to ground, when the hot wire field is much greater than the neutral wire field within the sensor, versus the transformer output for currents that flow from the hot wire and return equally and oppositely on the neutral wire wherein the fields within the sensor are equal and opposite. This difference in transformer output between line to ground currents versus line to line currents, in the case of the AFCI sensor function, causes the unwanted effect of the current transformer producing larger output signals for currents from line to ground, such as from filters and the like, than line to line signals for the same or greater magnitudes of arc fault current. This can lead to false tripping on small nuisance ground currents. Typically the problem arises in having the same arc signal output that occurs from a load limited series arc fault, where maximum circuit sensitivity is required, as that signal which may be produced by di/dt arc mimicking currents flowing through lumped filter capacitance from line to ground.

To negate this effect, and still have a sensor transformer which can perform one of the GFCI transformer functions, two secondary windings are connected in series in an asymmetrical way, with each winding wound on a portion of a core next to the hot and neutral wires respectively, in a connective way which allows sensing of the hot and neutral wire fields, when each carries an equal and opposite direction current and field within the sensor core, to produce a sensed signal. Locating the windings this way causes each winding to intercept the respective fields produced from the hot and neutral primary wires in a way which acts to diminish common mode noise signals, such as noise currents from line to ground, but acts to increase signal produced by arc fault currents from line to line, and series arc faults caused by a discontinuity in either the hot or neutral wires.

In addition, further noise rejection is preferably accomplished by producing an arc fault signal acceptance bandwidth by forming each winding so that it is self resonant with its parasitic capacitance, or a capacitance connected in parallel with the winding. The resonant frequency can be selected to be above, and to reject the frequency range of unwanted noise sources such as power line carriers.

Transformers of this type which have equal turn hot and neutral primaries are also desirable because the normal field cancellation which occurs within the core prevents the core from saturating over a wide range of arc fault currents. By asymmetrical location of the sensor secondary windings, a sample of each of the hot and neutral fields can be sensed, without saturation of a small core of high permeability required for good sensitivity in a small size.

Current transformers with a high permeability capable of producing a large flux density in a small size, but with a low excitation current, are also required to act as grounded neutral transmitters.

The type of core which works well in a small arc fault sensor transformer also is the type which works well as a grounded neutral transmitter, and works well as a ground fault sensor, and thereby allows a natural marriage of the two functions.

An arc fault produces high frequency signals in response to a step change in current at the start of the arc and noise that exists during the arc. An arc fault can occur between load conductors, commonly termed a parallel arc fault, whose current is typically 75 amps or higher. An arc fault can also occur within a discontinuity in either the hot wire or neutral wire on the line side of the arc detector, or in the load hot or neutral wires on the downstream side of the arc detector, commonly termed a series arc fault, which current is typically 5 amps or higher. Frequency components associated with an arc fault cover a very wide spectrum from the power line frequency up into the GHZ range. The sensor of this invention is designed to detect a selected range of broadband arc fault frequencies while discriminating against arc mimicking frequencies.

Referring to FIG. 1A, a preferred embodiment of the sensor in which the sensor is a current transformer 1 is illustrated transformer 1 includes a physically small toroid shaped core 2, preferably made of ferrite, having an aperture through which line wire 7 and neutral wire 6 pass, the two conductors comprising primary windings of the transformer, core 2 also has a first secondary winding 102, adjacent to the hot primary wire, and a second secondary winding 100, adjacent to the neutral wire. Windings 100 and 102 are positioned on the core for the first winding 102 to receive more of the flux from the hot wire 7, and for the second winding 100 to receive more of the flux from the neutral wire 6.

Figure 1B:
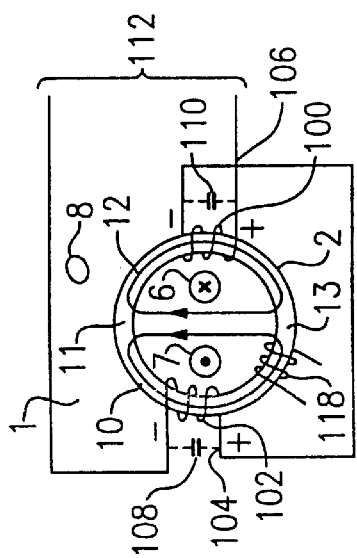

FIG. 1B shows a cross section of FIG. 1A with the 'dot' in hot wire 7 showing current out of the paper and the 'cross' in neutral wire 6 showing current into the paper for one half cycle of line current, with both 'dot' and 'cross' reversing during the next half cycle. Field lines 10 and 12 show the magnetic field lines set up by the current in hot 7 and neutral 6 wires respectively. When field lines are in opposite directions, in the same plane, the lines interfere and will not cross. This action causes field interference between the wires 6 and 7, causing the majority of the field 10 to divert into the core, generally at 11, and pass through winding 102 and back out again, generally at 13 as shown. Similarly the field 12, around the neutral wire 6, does the same action through the winding 100. In this mode the core behaves as if it were split at points 11 and 13 where the field lines 10 and 12 enter and leave the core. When the windings are wound as shown, the field 10 produces a positive voltage at winding end 104 of winding 102 and field 12 produces a positive voltage on end 106 of winding 100. Connecting the windings 100 and 102 together as shown will produce signal addition.

Also shown is parasitic winding capacitance 108 and 110 across windings 102 and 100 respectively forming resonate circuits with the windings. At a predetermined frequency, determined by the winding inductance's of winding 100 and 102, and parasitic winding capacitances 110 and 108 respectively, both of the resonant circuits will resonate and cause a Q rise in voltage across each winding 102 and 100. Because the circuits are series connected, the voltages add, producing a large signal across output 112. This voltage rise can be large enough to negate the need for a signal amplifier. The inductance windings 100 and 102, in this mode, behaves as if the core 2 was split as described above. The resonant point of both winding tanks can be selected so that the circuits resonate at a frequency band above the power line carrier band which extends from about 9 k to 400 khz, and above the significant 60 hz line frequency harmonics, and the frequencies generated by power line inverter harmonic type noise and the like. The resonant circuits reject, or reduce, signal from these and like sources. An external capacitance may be connected across each winding 102 and 100 to lower the resonant frequency point. In addition, an resistance may be added across each secondary winding 102 and 100 to lower the circuit Q and increase the response bandwidth. In a preferred embodiment, the resonant bandwidth is placed in the AM radio band where powerful local signal sources, such as from mobile or hand held transmitters are prohibited, and which therefore will not cause false signals from the sensor. The winding variables, or the external capacitance value, can be different for winding 100 and winding 102 circuit, producing different resonant frequencies which can be set to produced a double tuned effect, producing a bandwidth selected for arc fault noise. The voltage response across output 112 is shown in FIG. 1C, showing the double tuned effect where one winding circuit resonates at a frequency 111 and the other at 113, producing an arc noise acceptance bandwidth, but rejecting the power line carrier band 115 and the noise harmonics mentioned above.

Figure 1D:
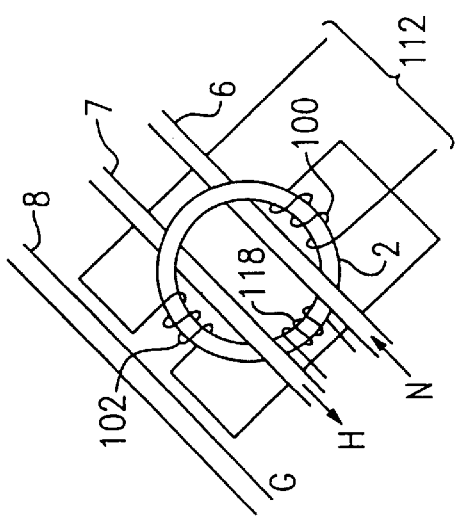
Figure 1C:
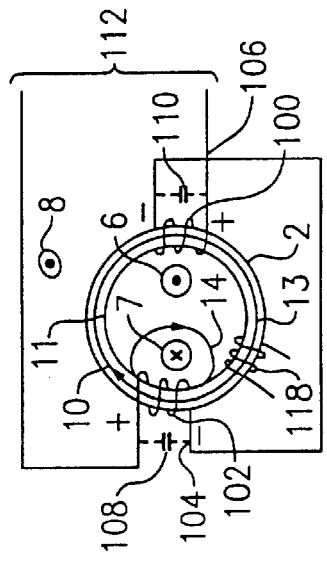

FIG. 1D shows what happens when common mode noise currents move down both the hot 7 and neutral 6 wires, both shown as hot 'cross' marked, and out 'dot' marked ground 8. In this mode, field 10 has reversed direction with respect to the same field 10 shown in FIG. 1B, causing a reversal of voltage across winding 102, which when added to the equal and opposite voltage across winding 100, causes a minimum voltage at the output terminals 112. This shows how the sensor rejects common mode noise voltage. In this mode fields tend to cancel between the hot 7 and neutral 6 causing one circulating clockwise flux in the core 2, but which still causes voltage cancellation at the output 112.

Figure 1E:
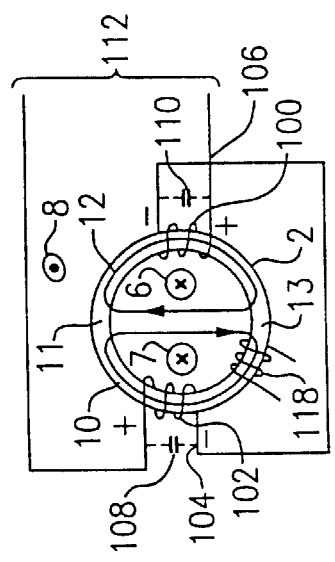

FIG. 1E shows what happens when noise currents move from the hot 'cross' marked wire 7 to 'dot' marked ground wire 8. In this mode there is no breaking out of field lines from core 2 at points 11 and 13, except for some leakage flux 14. Most of the flux 10 from wire 7 passes through windings 100 and 102, but once again the voltages are series opposing at output 112 with a commensurate reduction in output voltage. In this mode, there is no air gap encountered by the field lines 10, as which happens in FIG. 1B, where the field lines must break out of the core and traverse the air gap between the hot 7 and neutral 6 wires. In this mode field line 10 produces a large magnetic flux in the core 2 by acting on the cores magnetic domains without encountering an effective air gap. The much larger flux in core 2 produces a much larger voltage across windings 100 and 102, which being out of phase, once again tends to cancel at output 112. This larger voltage cancellation leaves a significant error voltage from incomplete cancellation and the leakage flux 14. By careful, core selection and winding parameters, this error voltage can be made large enough during arc fault events from hot wire 7 to ground wire 8 to produce enough signal output for arc fault detection, producing a similar sensor output for a series arc fault current which returns via ground wire 8 as for a series arc fault current which returns via neutral wire 6.

In the case of a combined arc fault sensor and ground fault sensor or grounded neutral transmitter, a third winding 118 would be added anywhere on the core 2, or one of the sensor windings 102 or 100 could serve the dual function.

Figure 2A:
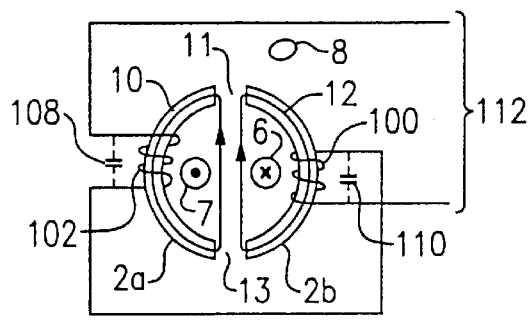
FIGS. 2(A–D) are schematic diagrams showing the sensor of FIGS. 1A–D, but with a split core.
Figure 2B:
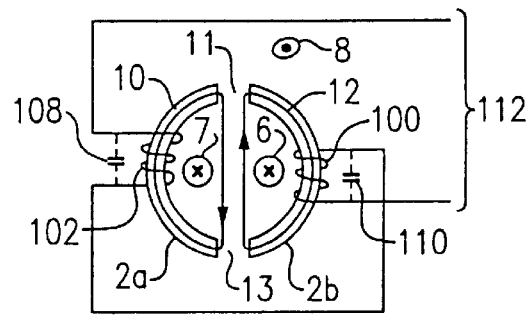
Figure 2C:
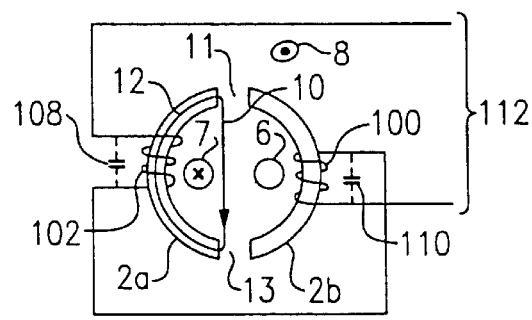
Figure 2D:
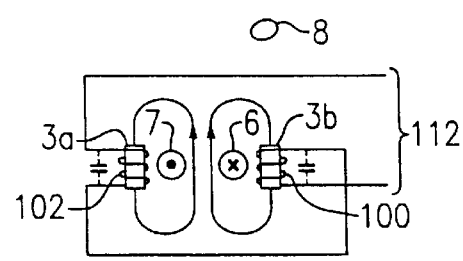

FIG. 2A shows the core 2 split into two parts 2a and 2b at the points where the field lines 10 and 12 would enter and exit an unsplit core. The action of the fields 10 and 12 in the split core behave similarly to the fields 10 and 12 shown in FIG. 1A. Likewise, the field lines 10 and 12 in FIG. 2B behave similarly to the field lines 10 and 12 in FIG. 1D. The major advantage of a split core is a much-reduced winding cost. FIG. 2C shows where the split core field action deviates from the solid core 2 shown in FIG. 1E. In FIG. 2C the field line 10 does not circulate around the entire core 2a and 2b but predominately through 2a because of the introduced air gap. This causes more output voltage across winding 102 than winding 100, and an increased output voltage at 112, which action is not as effective at rejection of noise currents from hot wire 7 to ground wire 8. Although, by holding the two core pieces 2a and 2b together, and reducing the air gap between the pieces, the split core will behave closer in action to that of the solid core in this mode. The action of self-resonance of windings 100 and 102 resonating with each parasitic winding capacitance acts in the same way as the solid core shown in FIG. 1A. FIG. 2D shows a logical extension of the split core where two bar cores 3 and 4 take the place of split core pieces 2a and 2b shown in FIG. 2A respectively.

Figure 3A:
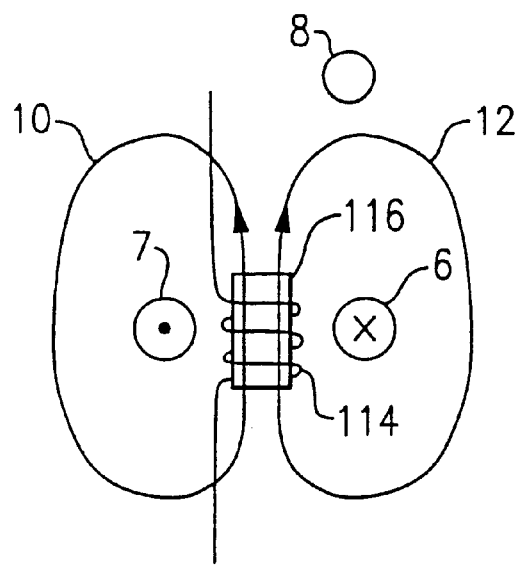
FIGS. 3(A–D) are the schematic diagrams of an alternate embodiment of common noise rejection, but arc fault noise signal addition, showing a bar core sensor positioned between the line and neutral wires.
Figure 3B:
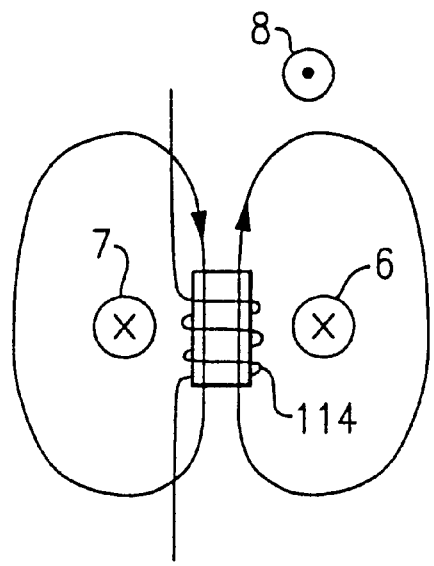
Figure 3C:
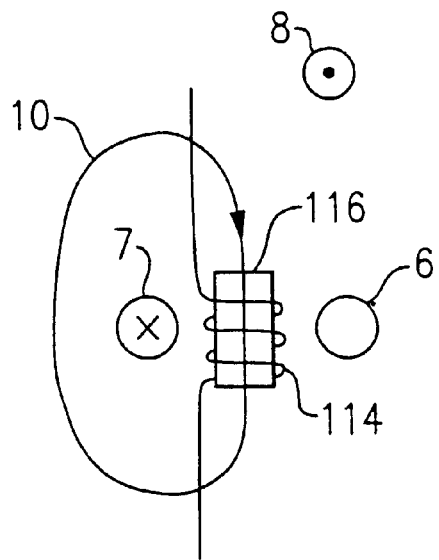
Figure 3D:
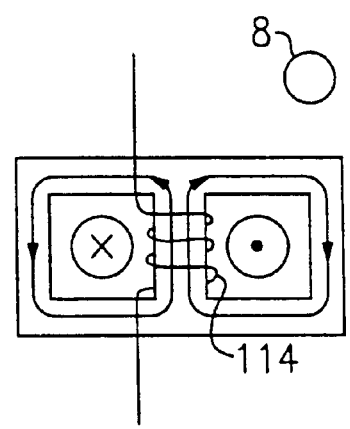

FIG. 3A shows yet another embodiment of a current sensor with a ferrite bar 116 including winding 114, which is oriented in-between the hot 7 and 6 neutral wires in a position to receive both the flux 10 and 12 generated by the hot 7 and neutral 6 wires. The field line 10, from 'dot' marked hot wire 7, and field line 12, from 'cross' marked neutral wire 6, are shown in the field orientation which occurs when a line to line arc fault or a series arc fault occurs as previously explained. In this mode, the fields 10 and 12 are in the same direction through the bar core 116 and produce signal adding. In FIG. 3B, the field lines 10 and 12 are shown for common mode noise currents to ground 8, which field lines 10 and 12 cause cancellation in core 116 and winding 114, reducing the output of the sensor for this unwanted noise pickup. FIG. 3C shows the case of a current flowing from hot 7 to ground 8. In this mode only field 10 from hot wire 7 cuts core 116, as no current flows through neutral 6, and the output is one half that of the output for the case shown in FIG. 3A. This still gives some signal reduction for this unwanted pickup mode, but does not give the good reduction as is produced by the FIG. 1E sensor. FIG. 3D shows a modification of the core where winding 116 is still located in-between hot 7 and neutral 6 wires, but on a solid figure eight type, but which may be a gapped 'E' type, core which surrounds both wires without an air gap. This configuration behaves the same as explained in FIGS. 3A–C but gives a larger signal output as the field lines 10 and 12 do not encounter an air gap. When the sensor is used as a dual function arc fault sensor and grounded neutral transmitter either a second winding is added in the same location as winding 114, or winding 114 serves both purposes.

Figure 4:
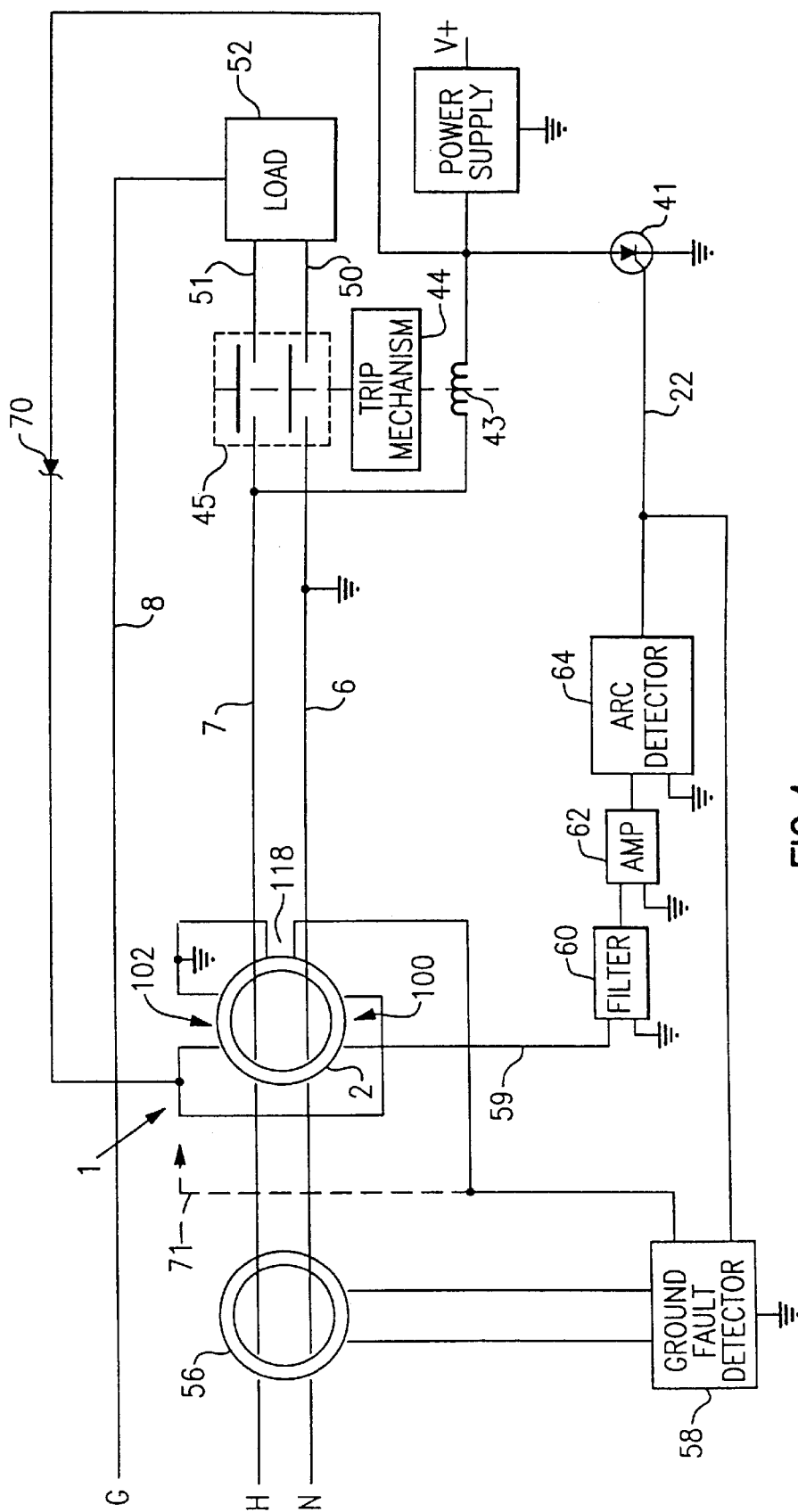
FIG. 4 shows a schematic diagram of how the sensors of FIGS. 1, 2, & 3, connect to arc and ground fault detectors operating a circuit interrupter.

FIG. 4 shows how the sensors described above in FIGS. 1A–1E, FIGS. 2A–D, and FIGS. 3A–D, couple to a combination Arc Fault Circuit Interrupter and Ground fault circuit interrupter, or AFCI/GFCI. The arc fault circuit interrupter shown in FIG. 4 is formed from small inexpensive components that can be easily integrated into an electrical receptacle, plug or in-line device. The circuit is designed to be manufactured in the same form as the ground fault circuit interrupter devices shown in U.S. Pat. Nos. 5,594,358 and 5,510,760 for example.

The arc fault circuit interrupter of FIG. 4 protects an electrical circuit including at least a neutral conductor 6 and a line conductor 7. A ground 8 may also be present and the arc fault circuit interrupter of FIG. 4 will detect arcs occurring between the line conductor and ground, the neutral conductor and ground, the line and neutral conductors, or a series discontinuity. The arc fault circuit interrupter may also detect power line frequency faults occurring between the line conductor and ground. A circuit interrupter 45 is connected in series with the line, between the power source and the load 52. A contactor or similar device may be employed, which includes a first set of contacts connected to the neutral conductor 6 and to the load by way of conductor 50, and a second set of contacts connected to the line conductor 7, and to the load by conductor 51. Preferably, the first and second contacts are spring loaded by a mouse trap type arrangement, controlled by trip mechanism 44. When the trip mechanism is activated, the spring-loaded contacts are open and latch in an open condition until they are manually reset. A device of this type is per se well known, and is shown, for example, in U.S. Pat. No. 5,510,760.

The output 58 of sensor 1, which is the preferred embodiment described in FIGS. 1A–E, showing one end of the sensor 1 winding 102 held at circuit reference, is coupled to filter 60 which further removes the fundamental 60 HZ line signal and the type of noise created by power supply inverters by passing through a high pass filter. The filter block 60 may also include a bandpass filter which compensates for the roll off-in the frequency response of the sensor, when the winding circuits resonate, as described in FIG. 1A, to produce a broader band of arc fault noise response. The filtered signal is amplified by optional amplifier 62, and applied to arc detector 64. Arc detector 64 detects predetermined arc fault signatures in the signal arriving at the input to the detector 64, and outputs a gate signal 22 to SCR 41 when a legitimate arc fault signature has been recognized. A bypass circuit to the arc detector block 64, operated by ground faults, is driven by the potential developed across winding 102 during large current ground faults. These ground faults cause large voltage saturation pulses across winding 102, as the core 2 goes in and out of saturation, which saturation voltage breaks over zener 70 and directly activates SCR 41. In this way, arcing faults activate SCR 41 via arc detector 64, large current ground faults of a predetermined value activate SCR 41 directly via zener 70. All AFCI circuitry described above constitutes a stand alone AFCI which is not dependent on GFCI sensor 56 and ground fault detector 58.

With the addition of ground fault sensor 56 and ground detector 58, which operation is well known in the prior art, the combination device will also detect ground faults. The GFCI negates the need for the ground fault bypass path through zener 70 as the ground fault sensor duplicates this function. The function of sensing a grounded neutral for the GFCI function requires a grounded neutral transmitter which transmits a current through the GFCI sensor 56 when the load neutral is coupled to ground. The design of sensor 1 allows for the addition of winding 118 which causes core 2 to perform the dual function of grounded neutral transmitter. Connection 71 shows an alternate connection in which winding 102 performs the dual function of arc fault sensing and grounded neutral transmitter. It will be understood by those skilled in the art that the sensor 1 shown in FIG. 4 could have as substitutions sensors shown and described in FIGS. 2A–D, and FIGS. 3A–D. It will also be understood that afci sensor windings 102 and 100 could have been wound on GFCI transformer 56 causing that transformer 56 to perform the dual function of arc fault and ground fault detection. Although all the primary windings of the sensors in FIGS. 1–3 show one turn primaries, each primary winding could be multiturn.

While the invention has been described in connection with a number of presently preferred embodiments thereof, those skilled in the art will recognize that many modifications, permutations, and changes may be made therein without departing from the true spirit and scope of the invention, which accordingly is intended to be defined solely by the appended claims.

What is claimed is:

1. A sensor for an arc fault detecting device for protecting an electric power circuit including a neutral wire and a hot wire, comprising:

a transformer with the neutral and hot wires forming primaries, a first secondary winding wound next to the hot wire, and arranged to receive more of the hot wire flux than the neutral wire flux; and a second secondary winding wound next to the neutral wire, and arranged to receive more of the neutral wire flux than the hot wire flux, and wherein the first and second secondary windings are connected as signal series adding for currents carried by the hot, neutral, or both which do not involve ground, and signal series opposing for currents carried by either the hot, neutral, or both which involve ground.

2. The sensor of claim 1 in which each of the first and second secondary windings self resonate with respective winding parasitic capacitance at predetermined first and second frequencies.

3. The sensor of claim 2 in which the first and second frequencies overlap into double tuned circuits and act to produce increased signal output over selected broad bandwidths of the arcing noise.

4. The sensor of claim 2 in which the first and second frequencies are each above 400 Khz.

5. The sensor of claim 2 comprising an additional capacitor connected across each secondary winding.

6. The sensor of claim 2 comprising an additional resistor connected across each secondary winding whereby the circuit Q is lowered thereby increasing the sensor bandwidth.

7. The sensor of claim 1 in which the transformer comprises a core having at least one air gap, which air gap lying along a line that is perpendicular to a line which bisects the cross sections of the hot and neutral wires.

8. The sensor of claim 7 in which the core comprises a toroid.

9. The sensor of claim 7 in which the core comprises a square.

10. The arc fault circuit interrupter transformer of claim 1 in which the transformer comprises a ferrite core.

11. An arc fault circuit interrupter comprising:
a transformer having a first core section which partially surrounds a hot wire; and
a second core section which partially surrounds a neutral wire, and
wherein a first secondary winding is wound on the first core next to the hot wire, which receives more of the hot wire flux than the neutral wire flux, and
a second secondary winding is wound on the second core next to the neutral wire, which receives more of the neutral wire flux than the hot wire flux, and
where the first and second secondary windings are connected as signal series adding for currents carried by the hot, neutral, or both, which do not involve ground, and signal series opposing for currents carried by either the hot, neutral, or both which involve ground.

12. The arc fault circuit interrupter of claim 11 in which each of the first and second secondary windings self resonates with its respective winding parasitic capacitance at a predetermined frequency.

13. The arc fault circuit interrupter of claim 11, where the windings resonate as resonate tank frequencies which overlap into double tuned circuits and act to produce increased signal output over a selected broad bandwidth of the arcing noise.

14. The arc fault circuit interrupter of claim 11 in which each secondary resonates at a frequency above 400 Khz.

15. The arc fault circuit interrupter of claim 11 comprising an additional capacitance connected across each secondary winding.

16. The sensor of claim 11 comprising an additional resistor connected across each secondary winding whereby the circuit Q is lowered thereby increasing the sensor bandwidth.

17. The arc fault circuit interrupter of claim 11 in which the core comprises a bar core.

18. The arc fault circuit interrupter of claim 11 in which the core comprises a ferrite core.

19. The arc fault detecting device of claim 11 comprising:
an electronic switch which activates a circuit interrupter, a zener diode directly coupling one or more of the sensor windings to the electronic switch, and
in which the zener diode is characterized by a breakover voltage selected at a predetermined level so as to allow the sensor output signal to directly trigger the electronic switch during large fault currents.

20. The arc fault detecting device of claim 11 comprising a ground fault detector, and in which the sensor transformer first or second windings, or both, act as a grounded neutral transformer transmitter.

21. The sensor of claim 20 in which a third winding acts as the grounded neutral transformer transmitter.

22. The sensor transformer of claim 20 in which a third winding acts as a ground fault transformer sensor.

23. A sensor for an arc fault detecting device where in a transformer comprises a bar core, in which the bar core is located between a neutral and a hot conductor in a position to receive the flux from both wires, and in which the flux from each wire re-enforces for a common mode current but decreases for differential load current, and in which the transformer comprises a first secondary acting as the sensor winding and one or more additional secondary windings connected as resonate tanks which resonate in the broadband arc noise spectrum and which act to increase the flux passing through the sensor secondary.

24. The sensor of claim 23 in which the first secondary also resonates in the broadband arc noise spectrum.

25. The sensor of claim 23 in which each secondary winding self resonates with its respective winding parasitic capacitance at a predetermined frequency.

26. The sensor of claim 23, where the resonate tank frequencies of the secondary windings overlap into double or N tuned circuits and act to produce increased signal output over selected broad bandwidths of the arcing noise.

27. The sensor of claim 23 in which each secondary resonates at a frequency above 400 Khz.

28. The sensor of claim 23 comprising an additional capacitance added across each secondary winding.

* * * * *